(12) United States Patent
Hayzen

(10) Patent No.: US 11,237,042 B2
(45) Date of Patent: Feb. 1, 2022

(54) WAVEFORM DATA THINNING

(71) Applicant: Computational Systems, Inc., Knoxville, TN (US)

(72) Inventor: Anthony J. Hayzen, Knoxville, TN (US)

(73) Assignee: Computational Systems, Inc., Knoxville, TN (US)

( * ) Notice: Subject to any disclaimer, the term of this patent is extended or adjusted under 35 U.S.C. 154(b) by 372 days.

(21) Appl. No.: 16/247,397

(22) Filed: Jan. 14, 2019

(65) Prior Publication Data

US 2020/0225078 A1 Jul. 16, 2020

(51) Int. Cl.
*G06F 17/40* (2006.01)
*G01H 1/00* (2006.01)
*G06F 17/14* (2006.01)

(52) U.S. Cl.
CPC .......... *G01H 1/003* (2013.01); *G06F 17/148* (2013.01)

(58) Field of Classification Search
CPC ..................................................... G01H 1/003
See application file for complete search history.

(56) References Cited

U.S. PATENT DOCUMENTS

| 6,026,348 | A | * | 2/2000 | Hala | ...................... G01H 1/003 702/126 |
| 6,507,804 | B1 | * | 1/2003 | Hala | ...................... G01H 1/003 702/182 |
| 2011/0098968 | A1 | * | 4/2011 | Srinivasa | ............... G01H 1/003 702/145 |
| 2014/0195197 | A1 | * | 7/2014 | Boerhout | .............. G01M 13/00 702/182 |
| 2018/0011065 | A1 | * | 1/2018 | Bowers, III | .......... G01N 29/50 |
| 2020/0317204 | A1 | * | 10/2020 | Kanbayashi | ............ G01P 15/00 |

FOREIGN PATENT DOCUMENTS

WO 2013020197 A1 2/2013

* cited by examiner

*Primary Examiner* — Mohamed Charioui
*Assistant Examiner* — Christine Y Liao
(74) *Attorney, Agent, or Firm* — Luedeka Neely Group, P.C.; Rick Barnes

(57) ABSTRACT

A method for producing a thinned representation of vibration waveform data. The waveform vibration data is received and divided into sequential blocks. For each sequential block, each serially designated in turn as a current block, the following steps are performed. When the current block is also a first block, the current block is passed as a reference block. A representative value for the current block is computed and compared to the representative value for the reference block to determine a difference. The representative value for the current block is compared to a minimum representative value. The current block is transformed into a spectrum and compared to the spectrum for the reference block to determine a correlation value. When the representative value for the current block is above the minimum representative value, the current block is passed as the reference block whenever at least one of the following is true, (a) the first difference is greater than a given difference, (b) the correlation value is less than a given correlation value, and (c) a numerical count of blocks between the current block and a most recently passed reference block is greater than a given maximum.

18 Claims, 4 Drawing Sheets

WAVEFORM DATA THINNING

FIELD

This invention relates to the field of vibration data management. More particularly, this invention relates to thinning—or in other words reducing—the amount of vibration waveform data required to represent the original data produced.

INTRODUCTION

Storage of continuous waveform data, such as that produced by a vibration sensor attached to a rotating machine, requires large amounts of storage space. For continuous, real-time storage this typically requires a local storage device of at least about one-hundred gigabytes. Even with this amount of space available, the continuous online vibration monitoring device can typically only store several days of waveform data. Once the storage device is full, a typical system must then over-write the old waveform data with new waveform data, such as by using a first-in first-out buffering process.

In addition, when an abnormal event occurs, the portion of the waveform data representing that event often needs to be saved for long term analysis. Such portions of the waveform data are typically on the order of about ten to one-hundred megabytes each. Over time this adds up to a large amount of data, often hundreds of gigabytes, that needs to be stored on the storage device.

Thus, the storage requirements for such applications are enormous, and the need often exceeds the amount of storage space that is reasonably available. Therefore, the amount of data that can be stored before being overwritten is often less than what is desired, and system users do not have access to the amount of historical data that they would like. Thus, decisions must be made by the users of such systems about which abnormal events can be saved and for how long they can be saved, where the only options available are often less than adequate.

What is needed, therefore, is a system that tends to reduce issues such as those described above, at least in part.

SUMMARY

The above and other needs are met by a method for producing a thinned representation of vibration waveform data. The waveform vibration data is received and divided into sequential blocks. For each sequential block, each serially designated in turn as a current block, the following steps are performed. When the current block is also a first block, the current block is passed as a reference block. A representative value for the current block is computed and compared to the representative value for the reference block to determine a difference. The representative value for the current block is compared to a minimum representative value. The current block is transformed into a spectrum and compared to the spectrum for the reference block to determine a correlation value. When the representative value for the current block is above the minimum representative value, the current block is passed as the reference block whenever at least one of the following is true, (a) the first difference is greater than a given difference, (b) the correlation value is less than a given correlation value, and (c) a numerical count of blocks between the current block and a most recently passed reference block is greater than a given maximum.

Thus, the spectral correlation method described herein, depending on configuration variables, reduces the amount of storage or bandwidth required by the waveform vibration data by several orders of magnitude, without losing any substantive machine vibration information, thereby enabling the real-time storage to be extended from several days to weeks or months, and to dramatically reduce long-term data storage and transmission requirements by several orders of magnitude.

In some embodiments according to this aspect of the invention, receiving the waveform vibration data includes receiving the waveform vibration data from a vibration sensor. In some embodiments, receiving the waveform vibration data includes receiving the waveform vibration data from a data storage device. In some embodiments, dividing the waveform vibration data into sequential blocks includes dividing the waveform vibration data into blocks of 8092 data points each. In some embodiments, dividing the waveform vibration data into sequential blocks includes dividing the waveform vibration data into blocks that each start at a leading tachometer signal within the waveform vibration data and end at a following tachometer signal within the waveform vibration data. In some embodiments, dividing the waveform vibration data into sequential blocks includes dividing the waveform vibration data into blocks that each contain waveform vibration data that represents a common number of rotations.

In some embodiments, the step of dividing the waveform vibration data into sequential blocks includes dividing the waveform vibration data into blocks that each contain waveform vibration data that represents a given minimum number of rotations. Some embodiments include storing all of the reference blocks on a non-transitory storage medium as the thinned representation of the vibration waveform data. Some embodiments include transmitting all of the reference blocks across a network connection as the thinned representation of the vibration waveform data. Some embodiments include passing a numerical count of non-passed current blocks between each passed reference block. In some embodiments, the step of computing a representative value for the current block includes computing a root mean square for the current block. In some embodiments, the step of transforming the current block into a spectrum includes performing a fast Fourier transform on the current block.

According to another aspect of the invention there is described an apparatus for producing a thinned representation of vibration waveform data. An input receives the waveform vibration data, and a processor divides the waveform vibration data into sequential blocks. For each sequential block, where each block is serially designated in turn as a current block, the processor does the following. When the current block is also a first block, the current block is passed as a reference block to at least one of a memory, a storage, and an output. A representative value for the current block is calculated, and the representative value for the current block is compared to the representative value for the reference block to determine a difference. The representative value for the current block is compared to a minimum representative value. The current block is transformed into a spectrum, and the spectrum for the current block is compared to the spectrum for the reference block to determine a correlation value. When the representative value for the current block is above the minimum representative value, then the current block is passed as the reference block whenever at least one of the following is true, (a) the first difference is greater than a given difference, (b) the correlation value is less than a given correlation value, and (c) a number of blocks between the current block and a most recently passed reference block is greater than a given maximum. Some embodiments include a vibration sensor for generating the waveform vibration data.

According to yet another aspect of the invention there is described a non-transitory computer-readable storage media having instructional steps that when performed by the computer produce a thinned representation of vibration waveform data. The computer receives the waveform vibration data and divides the waveform vibration data into sequential blocks. For each sequential block, each serially designated in turn as a current block, the following steps are performed. When the current block is also a first block, the current block is passed as a reference block. A representative value is computed for the current block, and the representative value for the current block is compared to the representative value for the reference block to determine a difference. The representative value for the current block is compared to a minimum representative value. The current block is transformed into a spectrum, and the spectrum for the current block is compared to the spectrum for the reference block to determine a correlation value. When the representative value for the current block is above the minimum representative value, then the current block is passed as the reference block whenever at least one of the following is true: (a) the first difference is greater than a given difference, (b) the correlation value is less than a given correlation value, and (c) a numerical count of blocks between the current block and a most recently passed reference block is greater than or equal to a given maximum.

In some embodiments according to this aspect of the invention, the instruction to receive the waveform vibration data includes an instruction to receive the waveform vibration data from a vibration sensor. In some embodiments, the instruction to receive the waveform vibration data includes receiving the receiving the waveform vibration data from a data storage device. In some embodiments, the instruction to divide the waveform vibration data into sequential blocks includes dividing the waveform vibration data into blocks that each start at a leading tachometer signal within the waveform vibration data and end at a following tachometer signal within the waveform vibration data. Some embodiments include an instruction to store all of the reference blocks on a non-transitory storage medium as the thinned representation of the vibration waveform data. Some embodiments include an instruction to transmit all of the reference blocks across a network connection as the thinned representation of the vibration waveform data.

DRAWINGS

Further advantages of the invention are apparent by reference to the detailed description when considered in conjunction with the figures, which are not to scale so as to more clearly show the details, wherein like reference numbers indicate like elements throughout the several views, and wherein.

DESCRIPTION

General Overview

According to various embodiments of the present invention, waveform data is thinned—or in other words, the amount of data used to approximate the waveform data is reduced—by discarding identified portions of the original waveform data. In one embodiment, the portions that are discarded are those that don't change too much from previous portions of the data (as described below). This is determined by saving some portions as reference blocks, and then comparing subsequent portions to the immediately prior reference block. If the data hasn't changed that much, then the subsequent portion is discarded. If the data has changed too much, then that portion is saved as a new reference block, and subsequent comparisons are made to that new reference block. In this manner, a large amount of substantially redundant data can be discarded without removing relatively important portions of the waveform data.

DETAIL DESCRIPTION

Figure 1:
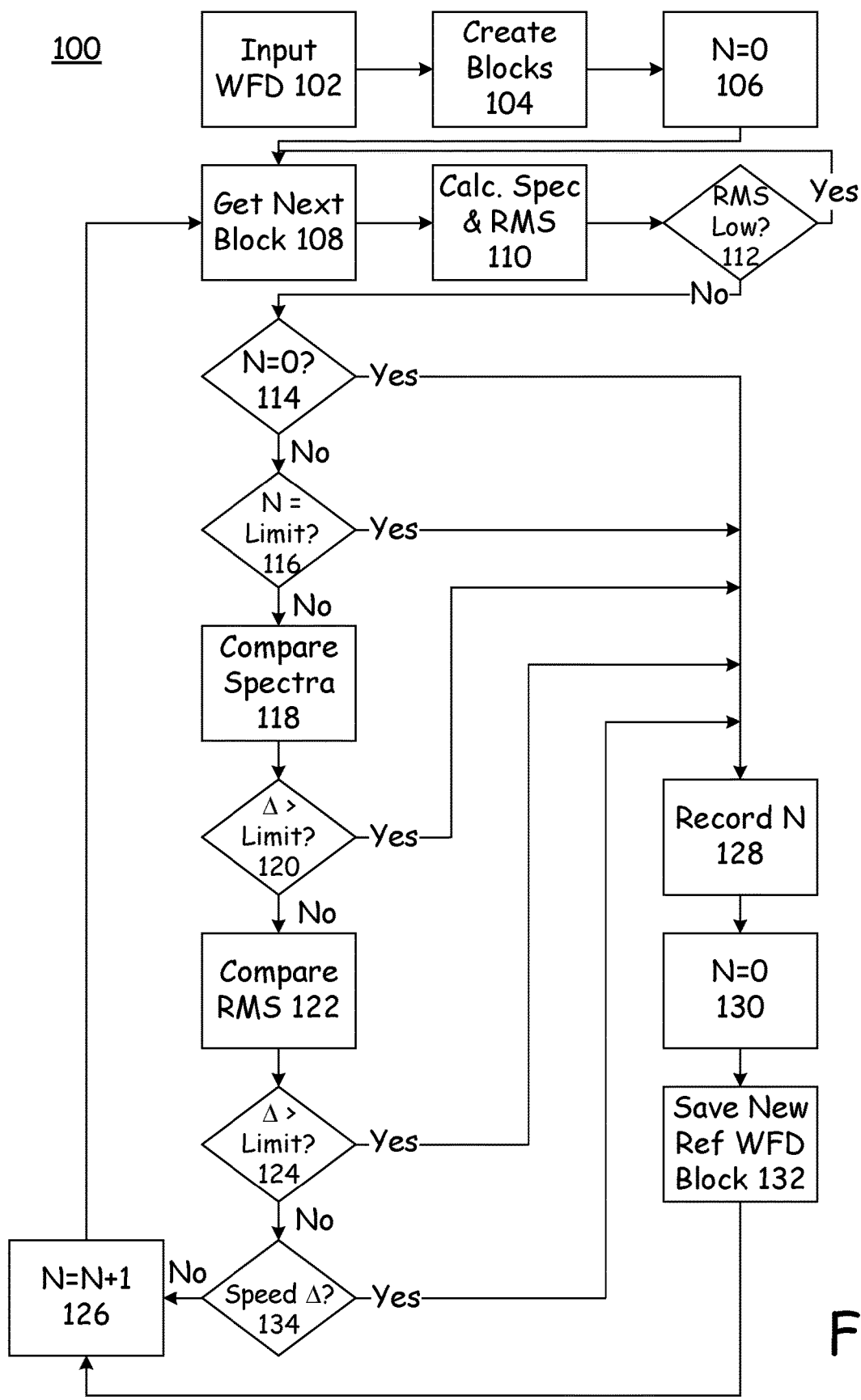
FIG. 1 is a flow-chart for a method for thinning waveform data according to an embodiment of the present invention.
Figure 2:
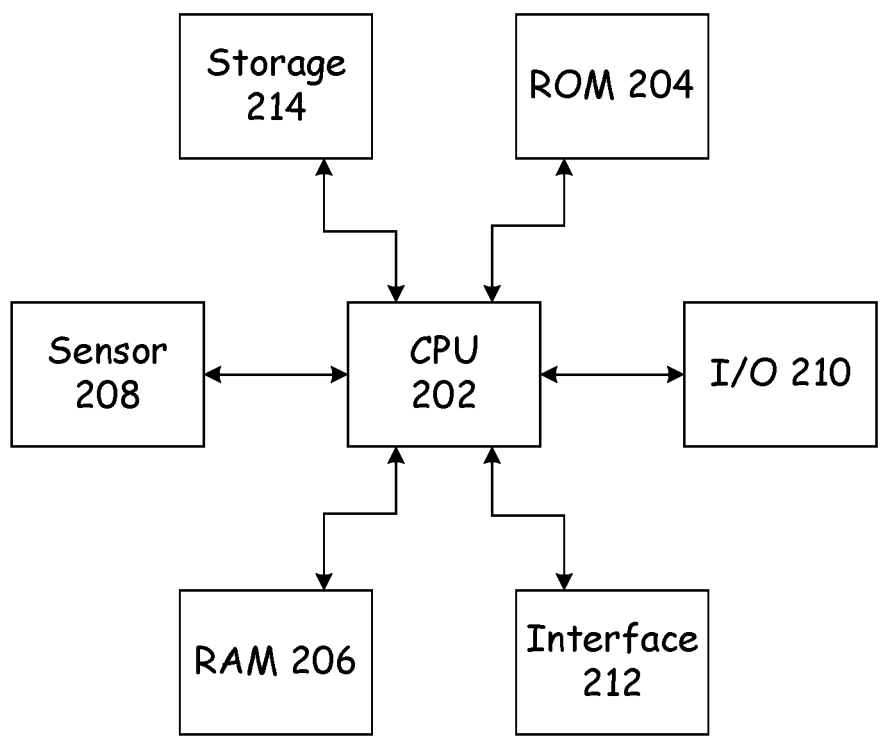
FIG. 2 is a functional block diagram of an apparatus for thinning waveform data according to an embodiment of the present invention.

With reference now to FIG. 1, there is depicted a method 100 for thinning waveform data according to an embodiment of the present invention. As given in block 102, the method starts by inputting waveform data. This input of waveform data can be provided by a sensor 208 as depicted in FIG. 2, which is generating live waveform data from a vibrating machine. Alternately, the waveform data can be provided from a data storage device 214, RAM 206, or ROM 204, such as might contain previously-generated waveform data. In yet another embodiment, the waveform data is received remotely over a network, such as through an input/output 210.

The waveform data is divided into blocks, in a serial manner, as given in block 104. In some embodiments the blocks include a given number of data points from what is typically otherwise a continual stream of waveform data values. In some embodiments the number of data values in each block is 8092. In some embodiments the number of data values in each block represents the same number of rotations of the machine from which the waveform data was taken. In some embodiments the number of rotations is from about ten to about fifteen. In some embodiments the number of data values in each block is based at least in part on the sampling rate of the sensor 208 taking the readings and the rotational speed of the machine from which the readings are taken.

In some embodiments the stream of waveform data values includes tachometer signals from the rotation of the machine, and so a definitive starting and ending point for each rotation of the machine is selected. In these embodiments, each block created can start, for example, with the data value next following a first tachometer signal, and can end, for example, with the data value immediately preceding a second tachometer signal. However, the first and second tachometer signal need not be consecutive tachometer signals. As described above, in some embodiments the block will contain from about ten to about fifteen rotations-worth of waveform data values, which in some embodiments will all start and stop as demarked by tachometer signals.

As given in block 106, when the blocks of waveform data are initially received, the counter N is set to zero, and the first block of data is input, as given in block 108. In block 110, a spectrum for the block is produced, such as by using a fast Fourier transform, and a representative value for the block is produced, such as by calculating a root mean square (RMS) value for the block.

In some embodiments, the representative value is compared against some user-specified minimum value, to see if the representative value is above or below the specified minimum value, as given in block 112. For example, if the representative value is below the specified minimum value, it can be an indication that the signal strength represented by the data in the block is too low, and the signal noise in the block is too high for valid processing. In some embodiments, if this is the case, then the method falls back to block 108 and the next waveform data block is fetched. However, if the representative value of the waveform data block is above the specified minimum value, then it can be an indication that the signal strength represented by the data in the block is sufficiently strong to be further processed by the method.

As given in block 114, if this is the first block of data to be processed to this point, which in the embodiment depicted means that the block is designated as N equals zero, then the method falls to block 128, and the value of N is recorded, which in this case is zero. N is then reset to zero as given in block 130, and the block is saved as a new waveform reference block, as given in block 132. These steps always occur for the first block of waveform data that is processed to step 114. The method then falls to block 126, N is incremented by one, and the method falls to block 108, where the next block of waveform data is fetched.

For each block of waveform data that is fetched, the spectrum and representative value is calculated as given in block 110, and the representative value is checked as given in block 112 to determine if the signal strength for the block is sufficiently strong.

However, as each block after the first block is processed, it is associated with an N value that is great than zero, and so the method falls from block 114 to block 116. In block 116, the value of N that is associated with the currently-processed block is compared to a user-defined limit. If the value of N associated with the block equals the limit, then the block is processed by recording the value of N as given in block 128, resetting the value of N to zero as given in block 130, and saving the currently-processed block as a new reference block as given in block 132. In this manner, a user can specify that every third block can be saved as a reference block, or every 100$^{th}$ block, or every 1,000$^{th}$ block, or so on, so that only a maximum number of blocks are disposed of between each block that is saved as a reference block.

If the limit has not been reached as tested in block 116, the spectrum for the current block is compared to the spectrum for the reference block, as given in block 118, such as with a goodness of fit correlation. Typically, there would be some difference between two blocks of waveform data, but the differences might not be sufficiently significant to warrant saving the current block in addition to the preceding reference block. For example, if the correlation between the two spectra is above a user-defined correlation limit of 0.90, for example, then the user might prefer to continue processing the current block and retain the existing reference block at this point.

However, if the difference between the two blocks is greater than the user-defined limit, such as indicated in block 120, then in one embodiment the current block is saved as the new reference block (as given in block 132), the value of N associated with the new reference block is recorded (block 128), N is reset to zero (block 130), and then incremented by one (block 126), and the next block is fetched for processing (block 108).

If the current block is not saved as the new reference block, as decided in block 120, then processing continues to block 122, where the representative value of the current block, such as the RMS, is compared to the representative value of the existing reference block. If the difference between the two blocks is too great, such that it violates a user-defined limit, as given in block 124, then the current block is stored as the new reference block, according to the processes described above. However, if the difference between the reference values for the current bock and the existing reference block do not violate the user-defined limit, then processing continues to block 134.

Block 134 is included in an embodiment where a tachometer signal is available with the waveform data that is input to the method 100, and the turning speed of the machine from which the waveform data is gathered can be determined. In this embodiment, block 134 determines whether a speed change represented by the block of data is sufficiently different from the speed of the existing reference block. If the speed change is greater than a user-defined difference, then the current block is saved as the new reference block as described above. If the speed change is less than the user-defined difference, then the value of N is incremented, and the next block is fetched.

It is appreciated that the order of the processing of the current block could be changed from that as given above, and a different selection of block characteristic testing could be implemented, having either more tests, fewer tests, or different tests.

In this manner, those blocks of waveform data that are not sufficiently different from the existing reference block are discarded and not saved, while those blocks of waveform data that are sufficiently different from the existing reference block are saved as new reference blocks. The output typically contains fewer block of data than the input, with the number N of discarded blocks between each reference block is recorded.

With reference again to FIG. 2, there is depicted an instrument 200 for thinning waveform data. In one embodiment, the instrument 200 is a computer that receives all of the waveform data through the input/output 210, or otherwise as described above, and does not include the sensor 208. In other embodiments, the instrument 200 is a computerized instrument that receives all of the waveform data through the sensor 208, thins the waveform data as described herein, and then sends the thinned waveform data out through the input/output 210 for remote storage or further processing. In some embodiments the steps of the method as described in regard to FIG. 1 are embodied in a computer language on a non-transitory medium that is readable by the instrument or computer 200 of FIG. 2, and enable the apparatus 200 to implement the thinning as described herein.

Figure 3:
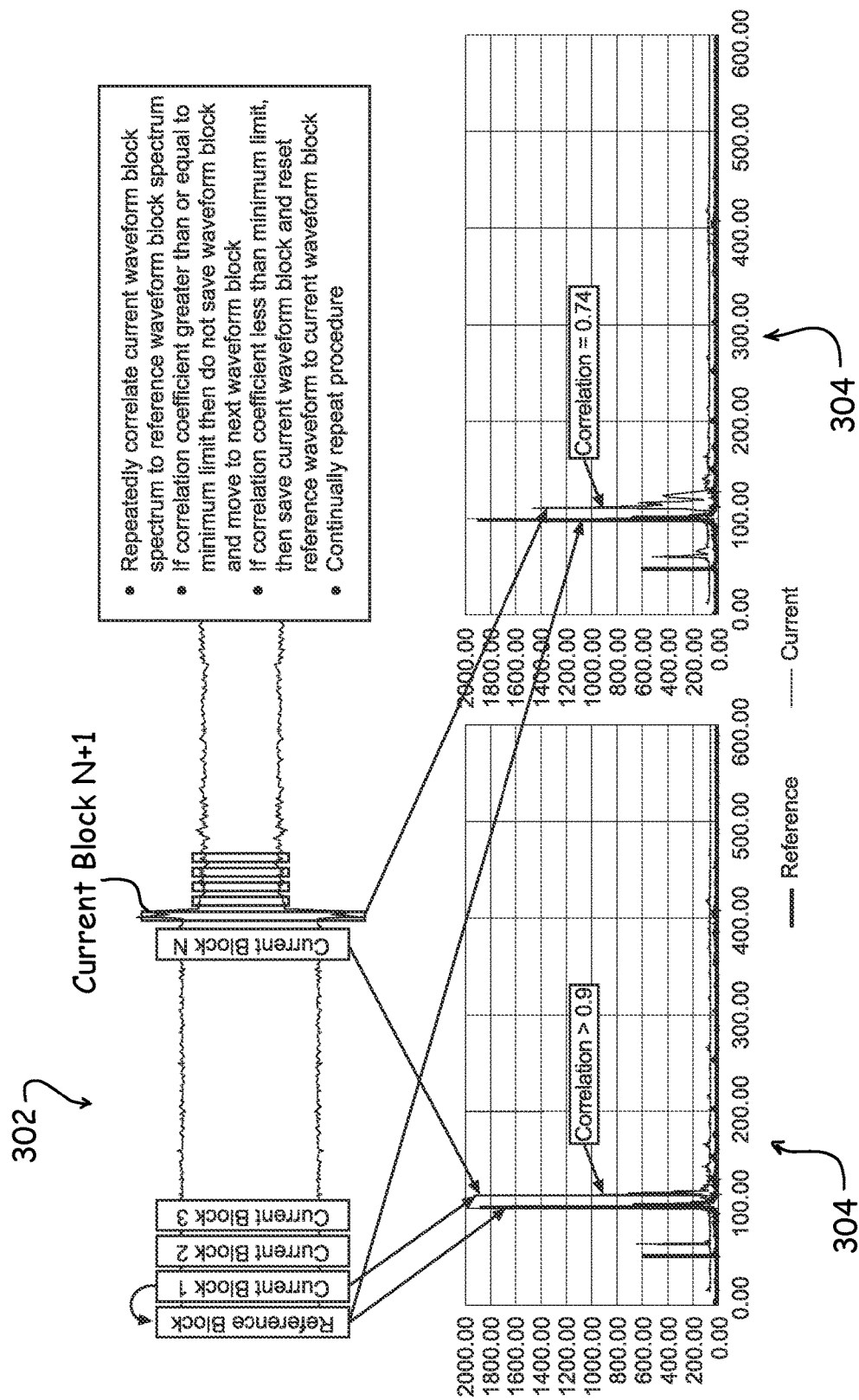
FIG. 3 is a first graphical representation of the method depicted in FIG. 1, according to an embodiment of the present invention.

With reference now to FIG. 3, there is given a graphical depiction of the method as described in regard to FIG. 1 above. As described, sequential waveform data blocks 302 are produced from the waveform data stream, by merely segmenting the data stream at desired positions. These blocks can be of any desired size, as described above. This segmentation can be accomplished either physically by writing the segmented data blocks into different data files, or logically by creating pointers to positions that define the boundaries between different data blocks within the data stream.

The waveform data in each block 302 is converted to a spectrum 304, as described above. The spectrum for the reference block is individually compared to each current block. For example, as indicated in FIG. 3, the spectrum for the reference block is compared to the spectrum for current block 1, and the mathematical correlation between the two blocks is found to be greater than 0.9. Thus, according to this criterion, current block 1 would not be stored, because there is not a sufficient difference between the reference block and current block 1. This same situation is true for all blocks from current block 1 through current block N.

However, when current block n+1 is compared to the reference block, the correlation as depicted is 0.74, which is below the desired limit. So in this example, current block n+1 would be stored, and current block n+1 would become the new reference block, against which subsequent current blocks are compared.

Figure 4:
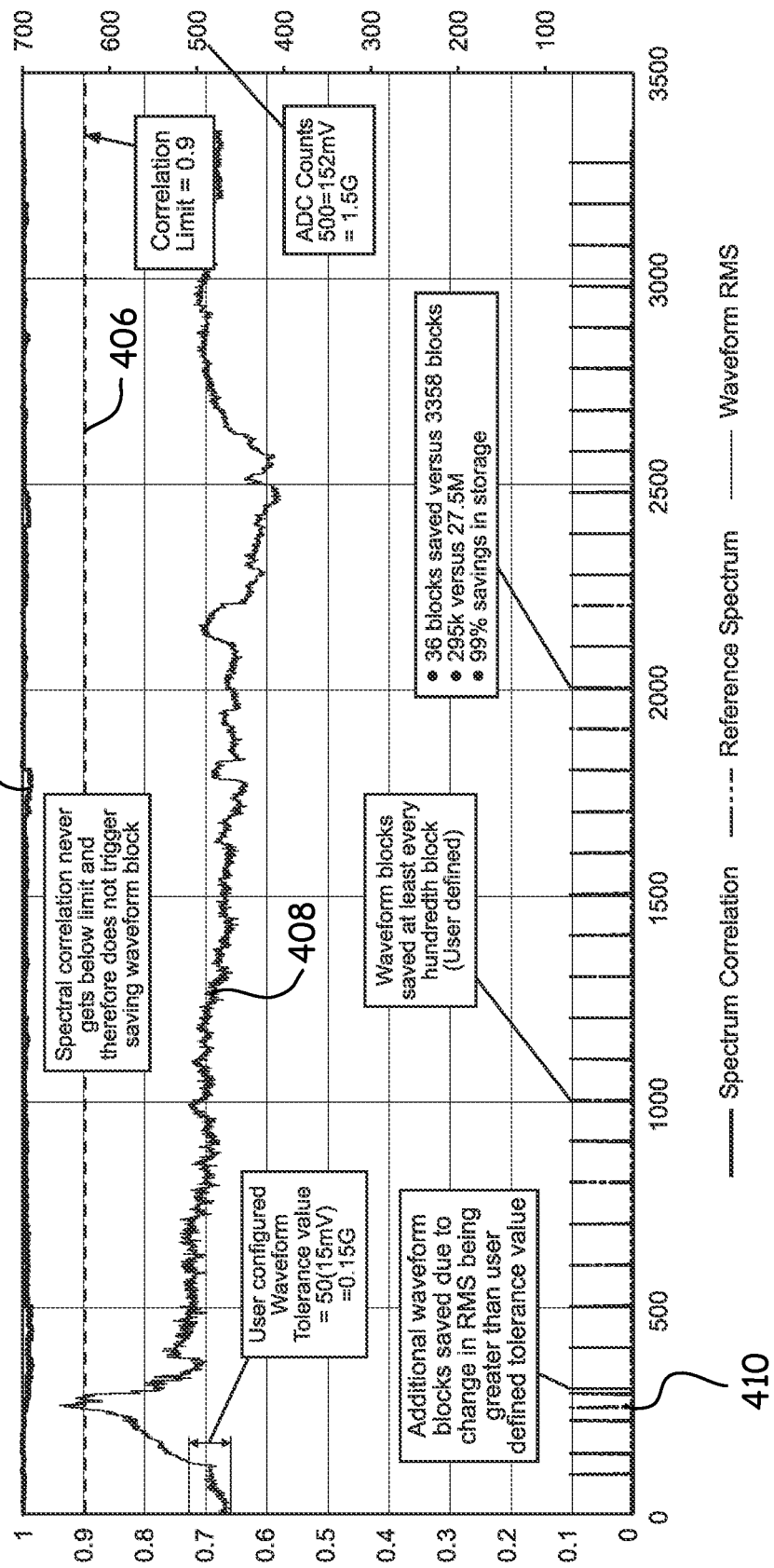
FIG. 4 is a second graphical representation of the method depicted in FIG. 1, according to an embodiment of the present invention.

With reference now to FIG. 4, there is given another graphical depiction of the method as described in regard to FIG. 1 above. In this example, the chart 402 includes several pieces of data, including running correlation values 404 between the reference block and subsequent current blocks, as measured on the left-hand axis of the chart 402, as well as the correlation limit 406. Also depicted is the running difference 408 between a representative value for each data block, which in the example given is a waveform RMS value, which difference is measured on the right-hand axis of the chart 402. Finally, there is also depicted an indication 410 of when a data block is saved.

As can be seen in FIG. 4, the spectral correlation between the data blocks never dips below the correlation limit 406. So according to that criterion, additional data blocks would not get saved. However, chart 402 depicts two additional criteria by which data blocks can get saved.

First, the differences 408 between the representative values for the data blocks is at some points greater than some user-specified maximum, and thus those data blocks get saved, even though their spectra are not statistically different from the spectrum of the reference block. This is depicted by a tick mark 410 along the bottom of the chart 402, which indicates that a data block is saved.

Second, a data block is saved after a given number of data blocks are evaluated, regardless of whether that data block violates the criterion of the spectral correlation limit 406 or the criterion of the difference in representative value 408. In the example as depicted, every hundredth data block is saved, even if it doesn't meet any of the other criteria for being saved.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A method for reducing storage space required for storing vibration waveform data on a non-transitory storage medium, the method comprising the steps of:
   receiving the waveform vibration data,
   dividing the waveform vibration data into sequential blocks, and
   for each sequential block, each serially designated in turn as a current block,
      when the current block is also a first block, passing the current block as a reference block,
      computing a representative value for the current block,
         comparing the representative value for the current block to the representative value for the reference block to determine a difference,
         comparing the representative value for the current block to a minimum representative value,
      transforming the current block into a spectrum,
         comparing the spectrum for the current block to the spectrum for the reference block to determine a correlation value, and
      when the representative value for the current block is above the minimum representative value, passing the current block as the reference block whenever at least one of the following is true,
         the first difference is greater than a given difference,
         the correlation value is less than a given correlation value, and
         a numerical count of blocks between the current block and a most recently passed reference block is greater than a given maximum, and
   storing all of the reference blocks on the non-transitory storage medium as a thinned representation of the vibration waveform data.

2. The method of claim 1, wherein the step of receiving the waveform vibration data comprises receiving the waveform vibration data from a vibration sensor.

3. The method of claim 1, wherein the step of receiving the waveform vibration data comprises receiving the receiving the waveform vibration data from a data storage device.

4. The method of claim 1, wherein the step of dividing the waveform vibration data into sequential blocks comprises dividing the waveform vibration data into blocks of 8092 data points each.

5. The method of claim 1, wherein the step of dividing the waveform vibration data into sequential blocks comprises dividing the waveform vibration data into blocks that each start at a leading tachometer signal within the waveform vibration data and end at a following tachometer signal within the waveform vibration data.

6. The method of claim 1, wherein the step of dividing the waveform vibration data into sequential blocks comprises dividing the waveform vibration data into blocks that that each contain waveform vibration data that represents a common number of rotations.

7. The method of claim 1, wherein the step of dividing the waveform vibration data into sequential blocks comprises dividing the waveform vibration data into blocks that each contain waveform vibration data that represents a given minimum number of rotations.

8. The method of claim 1, further comprising the step of transmitting all of the reference blocks across a network connection as the thinned representation of the vibration waveform data.

9. The method of claim 1, further comprising the step of passing a numerical count of non-passed current blocks between each passed reference block.

10. The method of claim 1, wherein the step of computing a representative value for the current block comprises computing a root mean square for the current block.

11. The method of claim 1, wherein the step of transforming the current block into a spectrum comprises performing a fast Fourier transform on the current block.

12. An apparatus for reducing storage space required for storing vibration waveform data on a non-transitory storage medium, the apparatus comprising:
   an input for receiving waveform vibration data,
   a processor for dividing the waveform vibration data into sequential blocks, and
   for each sequential block, each serially designated in turn as a current block,
      when the current block is also a first block, passing the current block as a reference block to at least one of a memory, a storage, and an output,
      computing a representative value for the current block,
         comparing the representative value for the current block to the representative value for the reference block to determine a difference,
         comparing the representative value for the current block to a minimum representative value,
      transforming the current block into a spectrum,
         comparing the spectrum for the current block to the spectrum for the reference block to determine a correlation value, and
      when the representative value for the current block is above the minimum representative value, passing the current block as the reference block whenever at least one of the following is true,
         the first difference is greater than a given difference,
         the correlation value is less than a given correlation value, and
         a number of blocks between the current block and a most recently passed reference block is greater than a given maximum, and
      storing all of the reference blocks on then on-transitory storage medium as a thinned representation of the vibration waveform data.

13. The apparatus of claim 12, further comprising a vibration sensor for generating the waveform vibration data.

14. A non-transitory computer-readable storage media comprising instructional steps that when performed by the computer reduces storage space required for storing vibration waveform data one a non-transitory storage medium, by causing the computer to:
   receive the waveform vibration data,
   divide the waveform vibration data into sequential blocks, and
   for each sequential block, each serially designated in turn as a current block,
      when the current block is also a first block, pass the current block as a reference block,
      compute a representative value for the current block,
         compare the representative value for the current block to the representative value for the reference block to determine a difference,
         compare the representative value for the current block to a minimum representative value,
      transform the current block into a spectrum,
         compare the spectrum for the current block to the spectrum for the reference block to determine a correlation value, and
      when the representative value for the current block is above the minimum representative value, pass the current block as the reference block whenever at least one of the following is true,
         the first difference is greater than a given difference,
         the correlation value is less than a given correlation value, and
         a numerical count of blocks between the current block and a most recently passed reference block is greater than a given maximum, and
      storing all of the reference blocks on the non-transitory storage medium as a thinned representation of the vibration waveform data.

15. The non-transitory computer-readable storage media of claim 14, wherein the instruction to receive the waveform vibration data comprises receiving the waveform vibration data from a vibration sensor.

16. The non-transitory computer-readable storage media of claim 14, wherein the instruction to receive the waveform vibration data comprises receiving the receiving the waveform vibration data from a data storage device.

17. The non-transitory computer-readable storage media of claim 14, wherein the instruction to divide the waveform vibration data into sequential blocks comprises dividing the waveform vibration data into blocks that each start at a leading tachometer signal within the waveform vibration data and end at a following tachometer signal within the waveform vibration data.

18. The non-transitory computer-readable storage media of claim 14, further comprising an instruction to transmit all of the reference blocks across a network connection as the thinned representation of the vibration waveform data.

* * * * *